United States Patent [19]

Muraoka et al.

[11] Patent Number: 4,849,608
[45] Date of Patent: Jul. 18, 1989

[54] APPARATUS FOR HEAT-TREATING WAFERS

[75] Inventors: Yusuke Muraoka; Atsushi Tamada, both of Hazukashi; Takamasa Sakai, Tenjinkita; Hitoshi Haibara; Keiji Nakagawa, both of Hazukashi, all of Japan

[73] Assignee: Dainippon Screen Mfg. Co., Ltd., Kyoto, Japan

[21] Appl. No.: 159,404

[22] Filed: Feb. 11, 1988

[30] Foreign Application Priority Data

Feb. 14, 1987 [JP] Japan .................. 62-32070
Aug. 31, 1987 [JP] Japan ................. 62-218440

[51] Int. Cl.⁴ .............................................. H05B 3/64
[52] U.S. Cl. ................................ 219/390; 219/536
[58] Field of Search .............. 219/390, 405, 411, 536, 219/406, 409, 413; 373/109, 117, 128; 338/291, 315

[56] References Cited

U.S. PATENT DOCUMENTS

| | | | |
|---|---|---|---|
| 1,234,499 | 7/1917 | Smalley | 219/390 |
| 2,006,685 | 7/1935 | Moore | 373/109 |
| 3,370,120 | 2/1968 | Lasch | 373/136 |
| 3,804,967 | 4/1974 | Werych | 219/390 |
| 4,048,473 | 9/1977 | Burkhart | 219/389 |
| 4,347,431 | 8/1982 | Pearce | 373/109 |

FOREIGN PATENT DOCUMENTS

60-148124 8/1985 Japan .
14746 of 1916 United Kingdom ................ 219/536

Primary Examiner—Teresa J. Walberg
Attorney, Agent, or Firm—Lowe, Price, LeBlanc, Becker & Shur

[57] ABSTRACT

An apparatus for heat-treating wafers including: a cylindrical body having an infrared reflection film formed on an interior peripheral surface thereof; a furnace core tube disposed within the cylindrical body for accommodating therein the wafers; a heater element provided within the cylindrical body for heating the furnace core tube, the heater being positioned outwardly remotely from an exterior peripheral surface of the furnace core tube in a manner to surround the tube; and a plurality of insulating heat-resistant bar members provided within the cylindrical body and extending in a direction parallel to the central axis of the furnace core tube for supporting the heater element.

23 Claims, 6 Drawing Sheets

APPARATUS FOR HEAT-TREATING WAFERS

FIELD OF THE INVENTION

The present invention relates to an apparatus for heat-treating semiconductor wafers (hereinafter referred to as "wafers") such as on oxidation furnace, diffusion furnace, CVD (chemical vapor deposition) apparatus, etc. which are employed for heat-treating the wafers.

BACKGROUND OF THE PRIOR ART

Such apparatuses include, for example, the one disclosed in Japanese Patent Application Kokai No. 60-148124, which is constituted by a furnace core tube for accommodating the wafers, a heating unit assembled of a heater member surrounding the tube and of an insulating heat-resistant cylindrical member made of an adiabatic material for supporting the heater member, and an outer cylinder for accommodating therein the furnace core tube and the heating unit. On the interior surface of the cylindrical member, there is formed a helical recess in which the heater member is wound and buried. On opposite ends of the outer cylinder, there are fixed adiabatic cylindrical supporting members for supporting both end portions of the furnace core tube so that the central axis of the tube and the winding central axis of the heater member can substantially coincide with each other.

In the above type of conventional apparatus, heat loss resulting from heat dissipation can be prevented due to the buried arrangement of the heater member in the interior surface of the adiabatic cylindrical member. However, problems are still encountered therewith. Specifically, no efficient use of the radiation heat from the heater member can be achieved, and an adiabatic cylindrical member of the heating unit having a large heat capacity requires a long time to obtain the desired temperature rise and drop during operation of the furnace core tube. Furthermore, deterioration of the heater member may result from heat accumulation in the burying recesses of the cylindrical member, which will lead to a a burnout of the heater member. In the event of such burnout, it is difficult to replace just the heater member alone since it is deposited in the recesses, and accordingly the entire heating unit usually must be exchanged as a whole. A problem arises in this case in that the apparatus may suffer from the production of many contamination particles at the time of the exchange because the adiabatic cylindrical member and the cylindrical supporting members are made of a material such as hardened ceramic fibers or the like which are liable to yield particles, if rubbed against the furnace core tube.

Moreover, since the furnace core tube is supported at its opposite end portions by the cylindrical supporting members, the tube is subjected to the intense bending or distorting force acting on its central portion by its own weight and also that of the wafers being treated disposed in the tube, with the result that maintaining coincidence of the central axis of the tube and the winding central axis of the heater member is very difficult. Consequently, the temperaure distribution in the furnace core tube is adversely changed, or it becomes difficult to extract the tube from the within of the outer cylinder.

SUMMARY OF THE INVENTION

With a view to solving the aforementioned problems, it is an objective of the present invention to provide a novel and improved apparatus for heat-treating of wafers.

It is another objective of the invention to provide an apparatus for heat-treating the wafers, according to which there is effected a reduction in the time required for temperature rise and drop of the furnace core tube with a small heat capacity of a heating means supporting member.

It is still another objective of the invention to provide an apparatus for heat-treating the wafers in which bending or distorting forces acting on the furnace core tube are dramatically reduced to render the tube substantially free of bending or distortion.

To attain the above and other related objectives, in accordance with a preferred embodiment of the invention, there is provided an apparatus for heattreating wafers, which has a cylindrical body having an infrared reflection film formed on an interior peripheral surface thereof; a furnace core tube disposed within said cylindrical body for accommodating therein said wafers; heating means provided within said cylindrical body for heating said furnace core tube, said heating means being positioned outwardly remotely from the exterior periphery of said furnace core tube in such a manner as to surround said tube; and a plurality of insulating heat-resistant bar members provided within said cylindrical body and extending in a direction parallel to the central axis of said furnace core tube for supporting said heating means.

In accordance with another aspect of the invention, there is provided an apparatus for heat-treating wafers, which includes: a cylindrical body; a furnace core tube disposed within said cylindrical body for accommodating therein said wafers; heating means provided within said cylindrical body for heating said furnace core tube, said heating means positioned outwardly remotely from the exterior periphery of said furnace core tube in such a manner as to surround said tube; a plurality of insulating heat-resistant bar members provided within said cylindrical body and extending in a direction parallel to the central axis of said furnace core tube for supporting said heating means; and a plurality of supporting members mounted on sadi bar members for cooperatively supporting said furnace core tube.

In a preferred embodiment, said heating means is a heater member helically wound at a predetermined pitch.

In another preferred embodiment, a plurality of spacer members are mounted on said bar members for maintaining said heater member at said predetermined pitch.

Preferably, said supporting members are cylindrical members externally fitted with said spacer members.

Still preferably, said bar members are made of a ceramic material.

Hence, according to the present invention, the amount of heat accumulation in the bar members for supporting the heating means that emits radiation heat to the bar members is reasonably small, and heat radiated to the cylindrical body by the heating means is reflected inwardly by the infrared relfection film formed on the interior peripheral surface of the cylindrical body, whereby efficient use of the radiated energy is effected. The temperature elevation of the furnace core tube is thus further promoted to assure the reduction of the operation times required therefor. Furthermore, the temperature drop of the tube is also rapidly performed because of the small heat accumulation of the bar members, thereby permitting a decrease in the time necessary for the execution of a temperature drop.

No overheating of the heating means occurs as a result of the heat accumulation in the heating means supporting member, since the heating means is supported by the bar members. Consequently, deterioration and burnout of the heating means can be prevented.

The bar members for supporting the heating means are free from the production of dust consequential to failure or abrasion when made of a ceramic material.

The heating means, when constituted by the helically wound heater member suppored by the bar members, can be replaced alone by taking it out along the bar members or together therewith, thus enabling easy replacement of just the heater member even in the event of its burnout.

Furthermore, since the furnace core tube is supported over its entire length by a plurality of supporting members mounted with the bar members according to the invention, any bending force acting on the furnace core tube can be dramatically reduced, with the result that no bending or distortion of the tube occurs.

BRIEF DESCRIPTION OF THE DRAWINGS

The foregoing and other objectives and attendant advantages of the present invention will be readily appreciated as the same become better understood by reference to the following detailed description when considered with the accompanying drawings, wherein.

DETAILED DESCRIPTION OF THE PREFERRED EMBODIMENTS

Now referring to the drawings, there are described below preferred embodiments of the invention.

Figure 1:
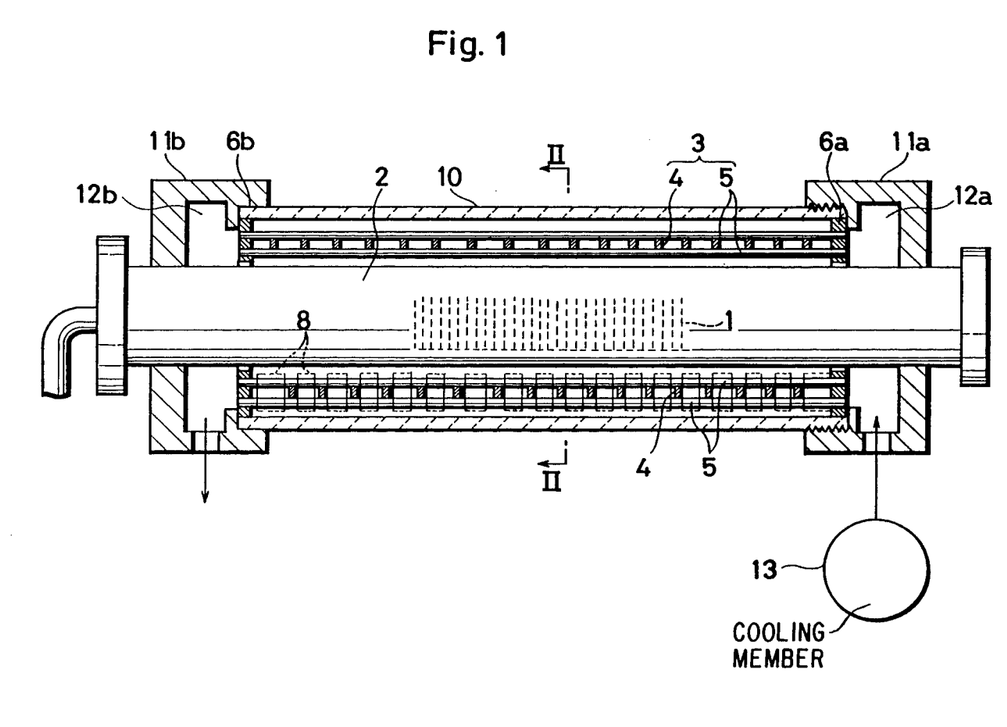
FIG. 1 is a schematic vertical partially sectional view illustrating a preferred apparatus for heat-treating wafers according to an embodiment of the first aspect of the invention.
Figure 2:
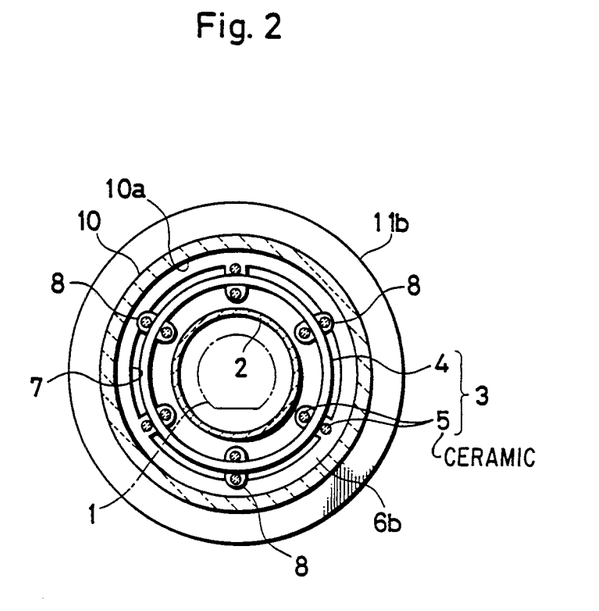
FIG. 2 is a section taken along the line II—II of FIG. 1.

FIG. 1 is a schematic vertical partially sectional view illustrating an apparatus for heat-treating wafers according to an embodiment of a first aspect of the invention, and FIG. 2 is a section taken along the line II—II of FIG. 1.

The apparatus is generally constituted by a furnace core tube 2 made of quartz or a ceramic material such as $S_iC$ for accomodating wafers 1, a heating unit 3 mounted externally remotely from the tube 2, an outer cylinder 10 mounted outwardly of the unit 3 for accommodating the tube 2 and the unit 3, a cooling member 13 for blowing cooling air into spaces defined between the tube 2 and the cylinder 10 in a direction parallel to the central axes of the tube and cylinder.

The furnace core tube 2 is inserted into the outer cylinder 10, so that both end portions thereof are thrust through a pair of flanges 11a and 11b and are supported thereby. The heating unit 3 is formed of a belt-like heater element 4 made of nichrome and helically wound around the tube 2 outwardly remotely from the exterior periphery of the tube 2, and a number of bars 5 provided around the tube 2 and extending in a direction parallel to the central axis of the tube 2 for supporting the heater element 4 such that the heater 3 surrounds the tube 2. The heater element 4 is long enough to be processed into a desired curved shape, and is sandwiched by pairs of the bars 5 at plural opposite side surface positions. Each of the bars 5 is fixed at both ends thereof on flanges 6a and 6b positioned at opposite openings of the cylinder 10. The heating unit 3 is freely inserted into the space between the tube 2 and the cylinder 10.

The bars 5 are advantageously made of a ceramic material containing aluminum oxide as a primary component thereof, and are adapted not to exert a significant heat accumulation effect due to their small heat capacity. In the drawings, reference numeral 8 denotes spaces also made of a ceramic material or the like for maintaining the helically wound form of the heater element 4 at a regular pitch of a predetermined width.

In the flanges 6a and 6b there are formed openings 7 for introducing the cooling air provided from the cooling member 13 into the above spaces. After releasing of the flanges 6a, the heater element 4 can be replaced by a new one by taking it out along the bars 5 or taking it together therewith.

In the flanges 11a and 11b, there are also formed suction and discharge ports 12a and 12b disposed to confront both the end faces of the cylinder 10, respectively. The port 12a communicates with the cooling member 13, and thus cooling air is introduced into the space between the tube 2 and the cylinder 10 via the port 12a and the openings 7 from the member 13 to cool the tube 2 and the heating unit 3. The cooling air passed through the spaces is discharged outside from the port 12b.

The outer cylinder 10 is made of a heat-resistant quartz glass, on an interior surface of which there is formed an infrared reflection film 10a. Accordingly, in increasing the temperature of the inside of the tube 2 to heat-treat the wafers 1, the film 10a performs a heat-insulation function, as it were, so as to prevent the heat dissipation from the cylinder 10, while inwardly reflecting radiationn heat emitted by the heating unit 3 to promote the temperature elevation at the core tube. In lowering the temperature to approximately room temperature, the heating unit 3 and the tube 2 are directly cooled by blowing of cooling air into the spaces between the tube 2 and the cylinder 10 to promote the temperature drop. The several bars 5 of the heating unit 3 have no detrimental effect on the facilitation of the temperature drop, since each of the bars absorbs only a small amount of heat and therefore the amount of the heat accumulation thereof can almost be disregarded.

Although the belt-like heater element 4 made of nichrome is spirally wound around the furnace core tube 2 in the above embodiment, the heater is not limited to such arrangement or construction. Furthermore, for example, a hollow element may be employed for the heater element. It is also possible to prepare numerous bar-shaped heaters and dispose them parallel with the bars 5. The heater may be a so-called ceramic heater.

Figure 3A:
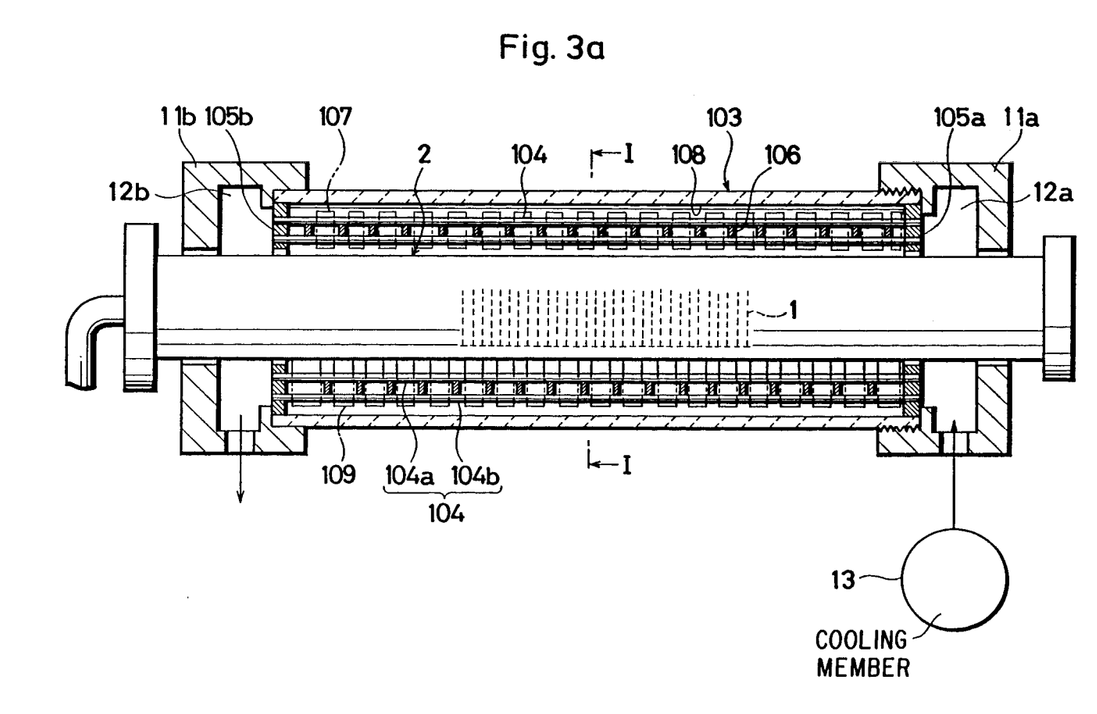
FIG. 3a is a schematic vertical partially sectional view depicting an apparatus for heat-treating wafers according to an embodiment of the second aspect of the invention.
Figure 3B:
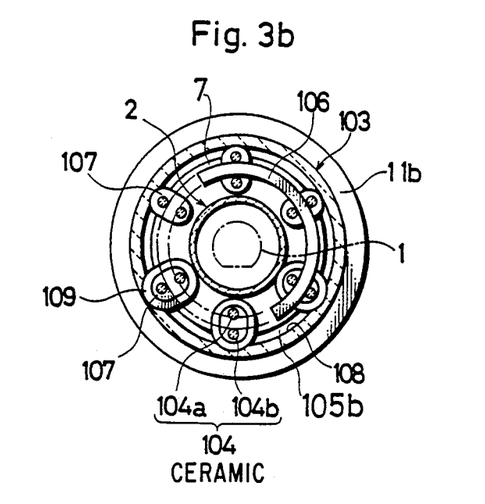
FIG. 3b is a section taken along the line I—I of FIG. 3b.
Figure 3C:
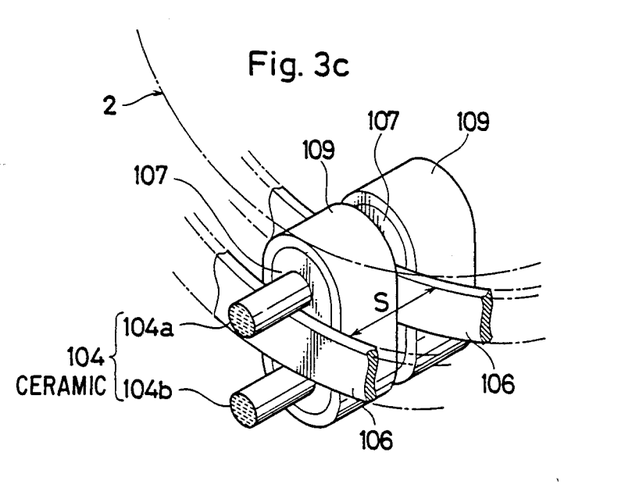
FIG. 3c is an enlarged perspective view partially showing an arrangement for supporting the furnace core tube of the embodiment.

FIG. 3a is a vertical schematic partially sectional view depicting an apparatus for heat-treating the wafers according to an embodiment of another aspect of the invention, FIG. 3b is a section taken along the line I—I of FIG. 3a, and FIG. 3c is an enlarged perspective view partially showing an arrangement for supporting the furnace core tube 2. In this embodiment, like parts are designated by like reference numerals of the earlier-discussed embodiment. The apparatus according to this embodiment is generally constituted by the furnace core tube 2 made of quartz glass or a ceramic material such as $S_iC$ for accommodating the wafers 1, an outer cylinder 103 into which the tube 2 is inserted, a helically wound belt-like heater 106, and a plurality of bars 104 for supporting the heater 106, furnace core tube supporting members 109, and the cooling member 13 for cooling the tube 2.

The bars 104 are disposed outwardly of the exterior periphery of the tube 2 in such a manner as to surround the tube and extend in a direction parallel to the central axis of the tube, for supporting the heater element 106 such that it is positioned outwardly remotely from the exterior periphery of the same and surrounds the tube 2. The bars 104 are each supported at both ends thereof by flanges 105a and 105b positioned at opposite openings of the cylinder 108, and are divided into pairs of inner and outer bars 104a and 104b. The inner bars 104a are spaced at regular intervals along an inner imaginary circle concentric to the central axis of the tube 2, whereas the outer bars 104b are spaced at regular intervals along an outer imaginary circle similarly concentric thereto.

The heater 106 is advantageously made of nichrome, and is sandwiched between and held by the bars 104a and 104b. When a predetermined pitch S at which the heater 106 is spirally wound is out of order, it will cause a change in the temperature distribution in the furnace core tube or an electrical of the heater. To avoid this and to maintain the pitch S, there are provided spacers 107 of width equal to the pitch S, each having two holes through which the pair of bars 104a and 104b are fitted. The bars 104 and the spacers 107 are usually made of a ceramic material containing aluminum oxide as respective primary constituents thereof, since the bars and the spacers so made that they are not susceptible to any adverse thermal effect by the heater 106. When the heat-treating apparatus is to be employed at a low-temperature, however, the bars and the spacers may be made of quartz glass or the like.

On the interior surface of the outer cylinder 103 made of quartz glass, there is formed an infrared reflection film 108 consisting of a thin film of gold or aluminum, for inwardly reflecting heat rays that are outwardly emitted from the heater 106, in order to improve the thermal efficiency of the apparatus. To attain the same end, the film 108 may alternatively be made on the exterior surface of the cylinder 103.

The supporting members 109 are constituted by tubular upholdes externally fitted with spaces 107 that are mounted with lower pairs of bars 104a and 104b, and thus cooperatively support the furnace core tube 2 substantially over its entire length, with the weights of the tube 2 and the wafers 1 being dispersively received. Although the kind of material for forming the member 109 is not limited, the one that is preferably selected which will produce no dust whatsoever even when rubbed against the tube 2 in the process of taking the tube out of the apparatus. Accordingly, quartz glass is advantageously employed for the material in this embodiment, as in the case of the tube 2 of the earlier-described embodiment. The upholders 109 are not necessarily provided on all the spacers 107. When upholders 109 are provided of at least the spacers 107 positioned at central and opposite end portions of the tube 2, it is possible to satisfactorily annul the bending force acting on the tube 2. Thus, the tube 2 can be supported by the members 109 with its central axis coinciding with the winding central axis of the heater 106.

In the flanges 11a and 11b through which the opposite end portions of the tube 2 are inserted, the suction and discharge ports 12a and 12b are so formed as to confront the opposite end faces of the cylinder 103 respectively, like the case of the earlier described embodiments of the first aspect of the invention. Furthermore, the openings 7 are also formed in the flanges 105a and 105b in order for the ports 12a and 12b to communicate with each other. Thus, for example, cooling air is blown into the port 12a by the cooling member 13 and is thereafter introduced into the space defined between the tube 2 and the cylinder 103 to cool the tube 2, the heater 106, and the bars 104. The cooling air passed through the spaces is discharged outside via the port 12b. Consequently, a rapid temperature drop of the tube 2 can be effected when the above cooling operation is performed, because of the small heat capacity of the bars 104.

Figure 4A:
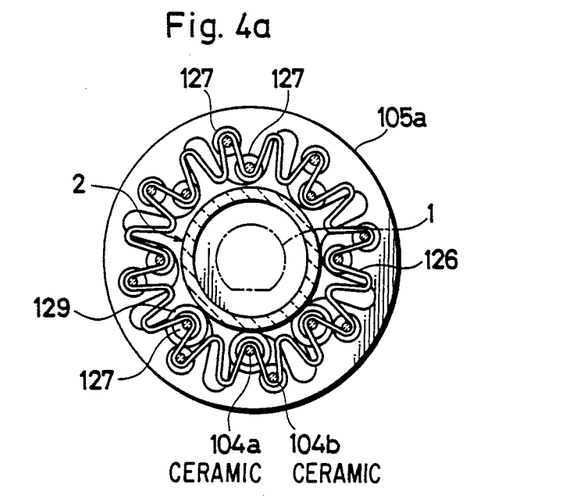
FIG. 4a is a transversely sectional view illustrating another embodiment of the invention.
Figure 4B:
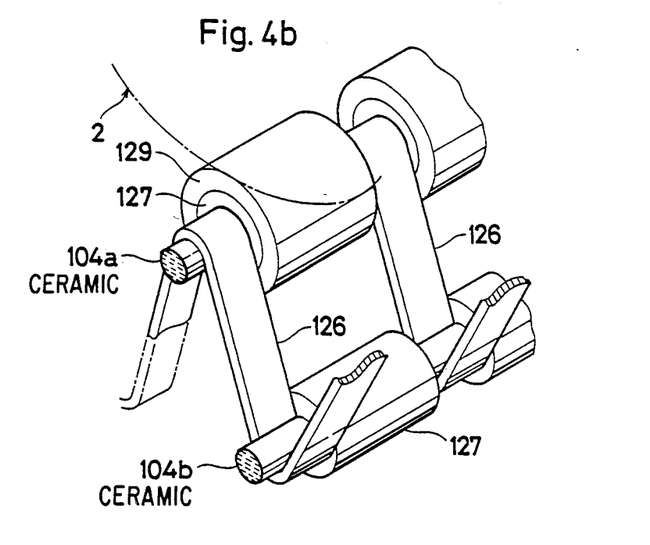
FIG. 4b is an enlarged perpsective view partially depicting an arrangement for supporting the furnace core tube of the embodiment.

FIG. 4a is a transversely sectional view illustrating another embodiment of the apparatus, and FIG. 4b is an enlarged perspective view partially depicting an arrangement for supporting the furnace core tube in the embodiment.

In this embodiment, there is prepared a helically wound belt-like heater 126 of an undulant shape, which is supported by pairs of bars 104a and 104b at several undulant tops and valleys. The furnace core tube 2 is supported by tubular upholders 129 externally fitted with those spacers 127 which are mounted with the bars 104a of the lower pairs.

Figure 5A:
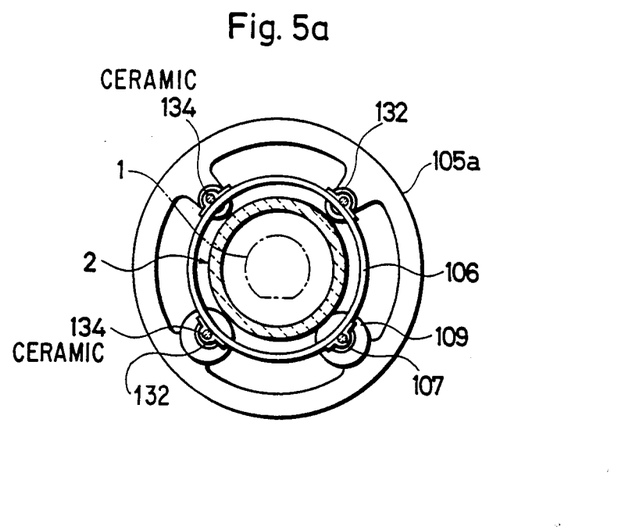
FIG. 5a is a transversely sectional view showing still another embodiment of the invention.
Figure 5B:
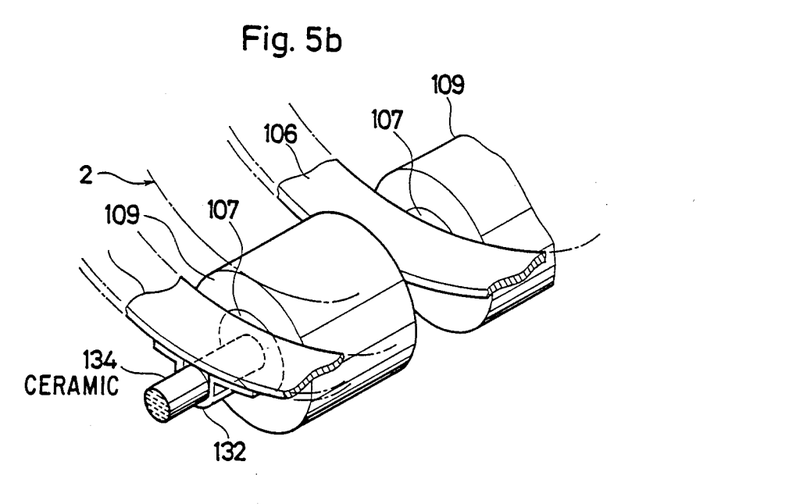
FIG. 5b is an enlarged perspective view partially illustrating an arrangement of the embodiment.

FIG. 5a is a tranversely sectional view depicting a further embodiment of the apparatus, and FIG. 5b is an enlarged perspective view partialy showing an arrangement for supporting the furance core tube.

In this embodiment, the belt-like heater 106 is secured to bars 134 by means of fixing pieces 132. The furnace core tube 2 is supported by tubular upholders 109 externally fitted with spacers 107 mounted with those bars 134 which are disposed at lower levels.

Although the spacers and the tubular upholders are separately formed in the above embodiments, they may be integrally formed and mounted with the bars. Alternatively, the upholders may be immediately and integrally formed on the bars for supporting the furnace core tube. The upholders may be provided only on central and opposite end portions of the bars.

While only the preferred embodiments of the present invention have been described above, it should be understood that various modifications may be made herein without departing from the spirit of the invention and scope of the appended claims.

What is claimed is:

1. An apparatus for heat-treating wafers, comprising:
a hollow cylindrical body having an infrared reflection film formed on an interior peripheral surface thereof;
a furnace core tube disposed within said cylindrical body for accommodating wafers placed therein for heat-treatment;
heating means provided within said cylinderical body for heating said furnace core tube, said heating means being positioned outwardly remote from an exterior peripheral surface of said furnace core tube in such a manner as to surround said tube; and
a plurality of insulating heat-resistant bar members provided within said cylindrical body and extending outside said core tube in a direction parallel to an axis of said furnace core tube, said bar members supporting said heating means in a position inwardly remote from the interior peripheral surface of said cylindrical body.

2. An apparatus according to claim 1, wherein:
said bar members comprise a ceramic material.

3. An apparatus according to claim 1, wherein:
said film comprises a thin layer of gold.

4. An apparatus according to claim 1, wherein:
said film comprises a thin layer of aluminum.

5. An apparatus for heat-treating wafers, comprising:
a hollow cylindrical body;
a furnace core tube disposed within said cylindrical body for accomodating wafers placed therein for heat-treatment;
heating means provided within said cylindrical body for heating said furnace core tube, said heating means being positioned outwardly remote from an exterior peripheral surface of said furnace core tube in such a manner as to surround said tube;
a plurality of insulating heat-resistant bar members provided within said cylindrical body and extending in a direction parallel to a central axis of said furnace core tube, said bar members supporting said heating means in a position inwardly remote from the interior peripheral surface of said cylindrical body; and
a plurality of supporting members mounted on said bar members for cooperatively supporting said furnace core tube.

6. An appartaus according to claim 5, wherein:
said heating means comprises a heater member helically wound at a predetermined pitch.

7. An apparatus according to claim 6, wherein:
a plurality of spacer members are mounted on said bar members for maintaining said heater member at said predetermined pitch.

8. An apparatus according to claim 5, wherein:
said supporting members are cylindrical members with said spacer members externally mounted thereto.

9. An apparatus for heat-treating wafers, comprising:
a hollow cylindrical body having an infrared reflection film formed on an interior peripheral surface thereof;
a furnace core tube disposed within said cylindrical body, for accommodating wafers;
heating means provided within said cylindrical body for heating said furnace core tube, said heating means being positioned in a space defined by an interior peripheral surface of said cylindrical body and an exterior peripheral surface of said furnace core tube in such a manner as to surround said tube;
a plurality of insulating heat-resistant bar members located in said space and extending in a direction parallel to an axis of said furnace core tube, said bar members supporting said heating means out of contact with said furnace core tube and said cylindrical body 10. An apparatus according to claim 9, further comprising:
a plurality of supporting members mounted on said bar members for cooperatively supporting said furnace core tube.

11. An apparatus according to claim 9, wherein:
said film comprises a thin layer of gold.

12. An apparatus according to claim 9, wherein:
said film comprises a thin layer of aluminum.

13. An apparatus according to claim 9, further comprising:
means for flowing a coolant flow in a generally axial direction through said space.

14. An apparatus according to claim 9, wherein:
said heating means comprises a heater element, having an undulating form along its length, that is helically wound at a predetermined pitch.

15. An apparatus according to claim 14, wherein:
a plurality of spacer members are mounted on said bar members for maintaining said heater member at said predetermined pitch.

16. An apparatus according to claim 15, further comprising:
means for upholding said core tube, fitted to said spacer members.

17. An apparatus for heat-treating wafers, comprising:
a hollow cylindrical body having an infrared reflection film formed on an exteior peripheral surface thereof;
a furnace core tube disposed within said cylindrical body, for accommodating wafers;
heating means provided within said cylindrical body for heating said furnace core tube, said heating means being positioned in a space defined by the interior peripheral surface of said cylindrical body and an exterior peripheral surface of said furnace core tube in such a manner as to surround said tube;
a plurality of insulating heat-resistant bar members located in said space and extending in a direction parallel to an axis of said furnace core tube, said bar members supporting said heating means out of contact with said furnace core tube and said cylindrical body.

18. An apparatus according to claim 17, wherein:
said bar members comprise a ceramic material.

19. An apparatus according to claim 17, further comprising:
a plurality of supporting members mounted on said bar members for cooperatively supporting said furnace core tube.

20. An apparatus according to claim 19, wherein:
said film comprises a thin layer of gold.

21. An apparatus according to claim 19, wherein:
said film comprises a thin layer of aluminum.

22. An apparatus according to claim 17, wherein:
said film comprises a thin layer of gold.

23. An apparatus according to claim 17, wherein:
said film comprises a thin layer of aluminum.

* * * * *